United States Patent
Haase

(10) Patent No.: US 9,318,637 B2
(45) Date of Patent: Apr. 19, 2016

(54) SOLAR CELL WITH IMPROVED CONVERSION EFFICIENCY

(75) Inventor: Michael A. Haase, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 29 days.

(21) Appl. No.: 14/126,315

(22) PCT Filed: Jun. 12, 2012

(86) PCT No.: PCT/US2012/042000
§ 371 (c)(1),
(2), (4) Date: Dec. 13, 2013

(87) PCT Pub. No.: WO2012/173959
PCT Pub. Date: Dec. 20, 2012

(65) Prior Publication Data
US 2014/0124022 A1    May 8, 2014

Related U.S. Application Data

(60) Provisional application No. 61/497,172, filed on Jun. 15, 2011.

(51) Int. Cl.
| | |
|---|---|
| *H01L 31/0725* | (2012.01) |
| *H01L 31/042* | (2014.01) |
| *H01L 31/18* | (2006.01) |
| *H01L 31/0687* | (2012.01) |
| *H01L 31/0224* | (2006.01) |

(52) U.S. Cl.
CPC .... *H01L 31/0725* (2013.01); *H01L 31/022425* (2013.01); *H01L 31/0687* (2013.01); *Y02E 10/52* (2013.01); *Y02E 10/544* (2013.01)

(58) Field of Classification Search
CPC ..... H01L 31/042; H01L 31/18; H01L 29/167; H01L 29/02
USPC .......... 136/244, 249, 256; 244/172.7; 257/98, 257/146
See application file for complete search history.

(56) References Cited

U.S. PATENT DOCUMENTS

| | | | |
|---|---|---|---|
| 5,248,631 A | 9/1993 | Park et al. | |
| 5,786,603 A * | 7/1998 | Rennie | B82Y 20/00 257/101 |
| 6,660,928 B1 * | 12/2003 | Patton et al. | 136/249 |
| 8,067,687 B2 * | 11/2011 | Wanlass | H01L 31/06875 136/249 |
| 2002/0117675 A1 * | 8/2002 | Mascarenhas | H01L 29/167 257/87 |
| 2003/0153165 A1 * | 8/2003 | Kondo | C23C 16/24 438/478 |

(Continued)

OTHER PUBLICATIONS

Haase, M.A., et al., "II-VI semiconductor color converters for efficient green, yellow, and red light emitting diodes", Applied Physics Letters, vol. 96, 231116 (2010).

(Continued)

*Primary Examiner* — Jeffrey T Barton
*Assistant Examiner* — Michael Y Sun
(74) *Attorney, Agent, or Firm* — Yufeng Dong; Daniel J. Iden

(57) ABSTRACT

Solar cells exhibiting improved conversion efficiency are disclosed. Particularly, multi-pn junction solar cells that contain a current spreading layer as well as concentrating photovoltaic modules that include such a solar cell and light concentrating optics are disclosed. The multi-pn junctions in question may generally be made up of III-V semiconductor materials, while the current spreading layer may generally be made up of II-VI semiconductor materials.

16 Claims, 4 Drawing Sheets

(56) References Cited

U.S. PATENT DOCUMENTS

| | | | |
|---|---|---|---|
| 2006/0102916 A1* | 5/2006 | Sun et al. | 257/98 |
| 2008/0128020 A1* | 6/2008 | Zafar | H01L 31/022425 136/252 |
| 2009/0159123 A1* | 6/2009 | Kothari | H01L 31/02165 136/256 |
| 2009/0211637 A1* | 8/2009 | Eaglesham | H01L 31/072 136/260 |
| 2010/0116942 A1* | 5/2010 | Fitzgerald | H01L 31/02167 244/172.7 |
| 2010/0301454 A1* | 12/2010 | Zhang | H01L 31/0687 257/614 |
| 2011/0005570 A1* | 1/2011 | Jain | B82Y 20/00 136/244 |
| 2011/0023958 A1* | 2/2011 | Masson | H01L 31/0201 136/256 |

OTHER PUBLICATIONS

King, R.R., et al., "40% Efficient Metamorphic GaInP/GaInAs/Ge Multifunction Solar Cells" Applied Physics Letters, vol. 90, 183516, 2007.

Maksimov, O., et el., "Reflectance and photoluminescence characterization of $Be_xZn_{1-x}Te$ epilayers", Thin Solids Films, vol. 467, 2004, pp. 88-92.

Vigue, F., et al. "Evaluation of the Potential of ZnSe and Zn(Mg)BeSe Compounds for Ultraviolet Photodetection", Journal of Quantum Electronics, vol. 37, No. 9, Sep. 2001.

* cited by examiner

SOLAR CELL WITH IMPROVED CONVERSION EFFICIENCY

FIELD

The present description relates to solar cells that exhibit improved conversion efficiency. Particularly, the present description relates to multi-pn junction solar cells that contain a current spreading layer as well as concentrating photovoltaic modules that include such a solar cell and light concentrating optics.

BACKGROUND

In the search for sources of energy alternatives to fossil fuels, a number of options have been explored, including geothermal energy, hydroelectric energy, hydrogen, biofuels and wind energy. However, an increasingly attractive alternative is the harnessing of solar power. Photovoltaic solar cells may be used to capture incident sunlight and convert absorbed photons into electrons and holes that flow through the cell, creating current and producing electricity. Unfortunately, one major historical drawback to the use of photovoltaic cells for energy conversion is the conversion efficiency of such cells. Energy from the incident sunlight that is lost may be attributed to reflection off of the photovoltaic cells, thermodynamic losses, the internal quantum efficiency of the cell, and conductive efficiency of the cell. The earliest photovoltaic cells converted only about 1 to 2% of energy from incident sunlight. Modern solar cells made up of single-pn junction silicon wafers are able to achieve maximum conversion efficiencies of between about 15 and 25. However, major recent advances have been made in this area. Using optical elements to concentrate a high flux of light onto a compound solar cell that is made up of multiple pn junctions as well as other crystalline materials, such as III-V semiconductors, researchers have achieved conversion efficiencies of around 40%. There is a great need in the art to provide solutions that will continue to improve the conversion efficiencies of such solar cells.

SUMMARY

In one aspect, the present description relates to a multi-junction solar cell. The multi-junction solar cell includes a first pn junction, a second pn junction positioned below the first pn junction, a current spreading layer positioned above the first pn junction, and an electrode positioned on the current spreading layer opposite the first pn junction. The first pn junction includes a first n-doped III-V semiconductor layer and a first p-doped III-V semiconductor layer. The second pn junction include a second n-doped III-V semiconductor layer and a second p-doped III-V semiconductor layer. The current spreading layer is a II-VI semiconductor layer and may have a band gap energy of greater than 2.8 eV, 3.1 eV or 3.4 eV. In at least some embodiments, the multi-junction solar cell may further include a third pn junction positioned below the second pn junction. The multi-junction solar cell may also include a transparent conductor positioned between the electrode and the current spreading layer. In some embodiments, the multi-junction solar cell is part of a concentrating photovoltaic module.

In another aspect, the present description relates to a concentrating photovoltaic cell construction that includes an optical element capable of concentrating sunlight and a multi-junction solar cell. The optical element receives incident sunlight and focuses it on the multi-junction solar cell, such that light with an intensity of over 100 suns, or potentially over 150 suns or even over 200 suns, is incident upon the multi-junction solar cell. The multi-junction solar cell includes epitaxial III-V semiconductor pn junction and an epitaxial II-VI semiconductor current spreading layer positioned between the III-V semiconductor pn junctions and the optical elements, such that focused light from the optical element is incident upon the current spreading layer. In at some embodiments, the optical element may be a lens, such as a Fresnel lens, or potentially a mirror. The multi-junction solar cell may further include an electrode on the surface of the current spreading layer. In some embodiments the multi-junction solar cell may include transparent conductor between an electrode and the current spreading layer.

DETAILED DESCRIPTION

Compound photovoltaic solar cells with multiple pn junctions upon which concentrated light is incident are achieving never before seen levels of conversion efficiency. These cells may receive light that is at an intensity of in excess of 200 suns. The current density in such cells therefore may be in excess of 3 Amps/cm². Unfortunately, despite the heightened levels of conversion efficiency in these cells, parasitic resistances associated with the metal electrodes ("electrode resistance") and parasitic resistances with lateral current flow in the semiconductor layer nearest the light source ("spreading resistance") still significantly degrade the cells' efficiency, keeping the cells' performance below their theoretically capable levels of conversion. While spacing the electrodes on the surface of the solar cell closer together may reduce the spreading resistance, this may result in significantly more shadowing of the surface area, and thus less light that may enter the active regions solar cell and be converted into usable energy.

Increasing the thickness of the pn junction semiconductor layer nearest the light source may reduce the spreading resistance, but typically at the cost of degrading the conversion efficiency for short-wavelength light. Adding a transparent conductor for electrodes, such as ITO ($In_2O_3$:$SnO_3$) or ZnO:Al, is unfortunately not a viable solution because generally when these materials are deposited by typical means, such as sputter coating, the conductors do not form a low-resistance contact to the top semiconductor layer. The surface of the III-V semiconductor layer pins the Fermi level such that a Schottky barrier is formed when a conventional transparent conductor is applied, the height of which is largely independent of the conductor that is applied. In a well-engineered cell, losses due to series resistances can account for a decrease in efficiency of 6% at 500 suns intensity.

It would therefore be highly desirable to provide a multi-junction solar cell, and a concentrating photovoltaic module that utilizes such a solar cell, that can minimize spreading resistance. The current description describes such a solution by providing a II-VI semiconductor layer between the sun and the multiple pn junctions in the solar cell. The II-VI layer acts as a current spreading layer, epitaxially grown on a III-V surface of the solar cell. The layer acts to minimize conversion losses by providing low sheet resistance to current flowing laterally across the multi-junction solar cell to the electrodes while being transparent with a high band gap energy, and having a low electrical resistance at the II-VI/III-V heterointerface.

Figure 1:
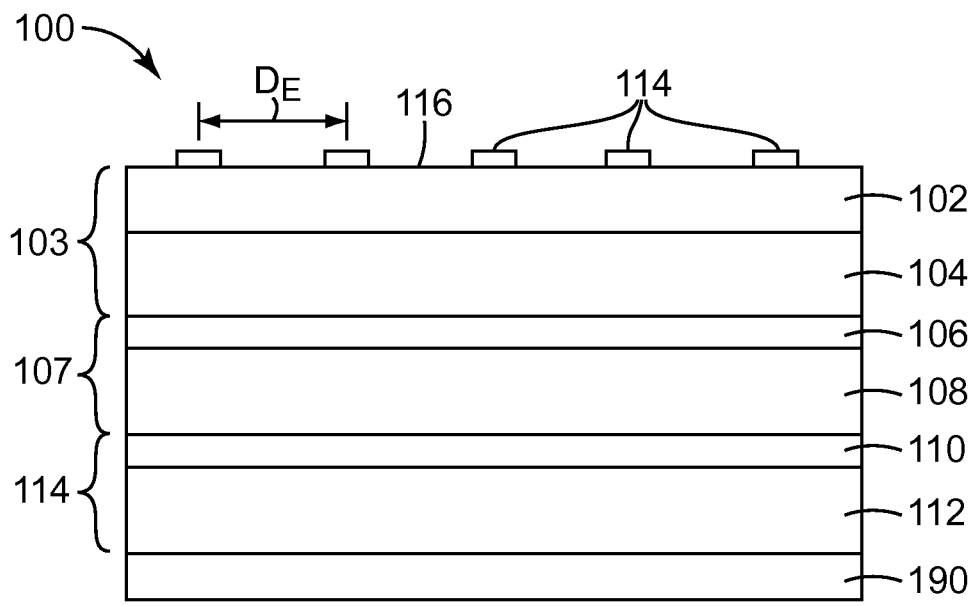
FIG. 1 is a cross-sectional view of a multi-junction solar cell.

FIG. 1 provides an illustration of a convention triple-junction solar cell 100 now used in the art. Triple-junction solar cell 100 may contain a first pn junction 103 made up of n-doped layer 102 and p-doped layer 104, a second pn junction 107 made up of n-doped layer 106 and p-doped layer 108, and a third pn junction 111 made up of n-doped layer 110 and p-doped layer 112. N-doped layers 102, 106, 110, and p-doped layers 104, 108, 112 may be made of any appropriate material, and at least in some cases, may be made up of a III-V semiconductor material. Typically, these junctions are fabricated monolithically and are connected in series by heavily-doped tunnel junctions. Beneath the bottom pn junction, in this case, beneath the third pn junction 111 and third p-doped layer 112 is a back electrode 190. One typical construction of a triple junction solar cell may be found in R. R. King, 40% *Efficient Metamorphic GaInP/GaInAs/Ge Multifunction Solar Cells*, Applied Physics Letters 90, 183516 (2007). Positioned on the surface 116 of n-doped layer 102 is an electrode 114 made up of interconnected segments. Unfortunately as discussed above, in the construction illustrated in FIG. 1, the electrode portions must be spaced together at a very close distance $D_E$. This is because the electrode portions 114 must be spaced close together to reduce spreading resistance, and current losses in layer 102. Unfortunately, of course, where electrode 114 is made up of an opaque material, the electrode shadows the portions of surface 116 where it is positioned thus allowing less incident sunlight to be converted into usable energy. As also briefly mentioned, using a transparent electrode for electrode 114 is not a viable solution because commonly used transparent electrode materials, such as ITO, do not form low-resistance contacts with surface 116.

Figure 2:
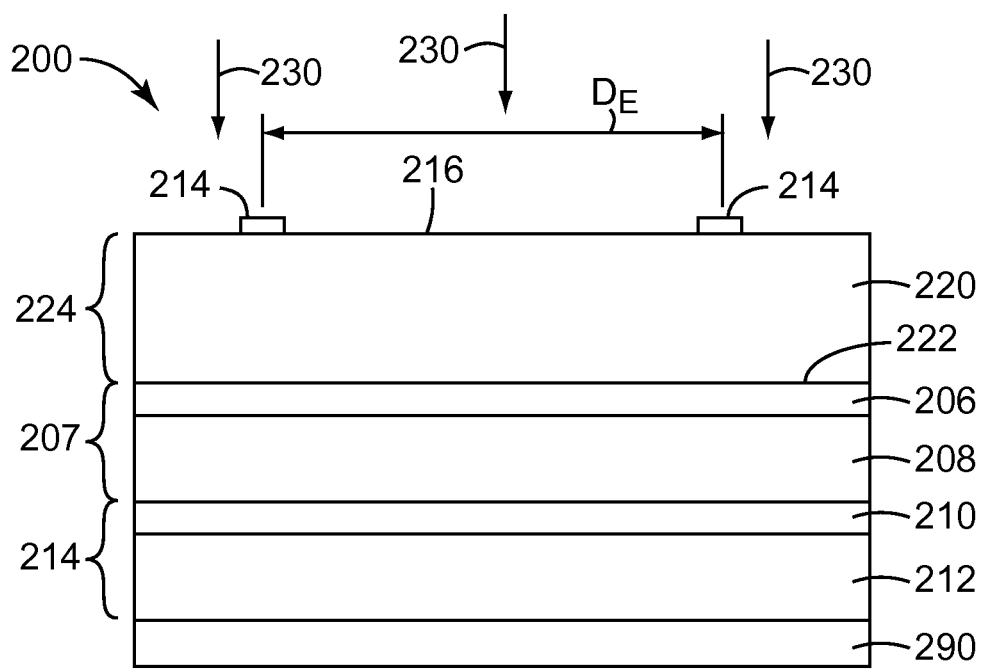
FIG. 2 is a cross-sectional view of a multi-junction solar cell according to the present description.
Figure 3:
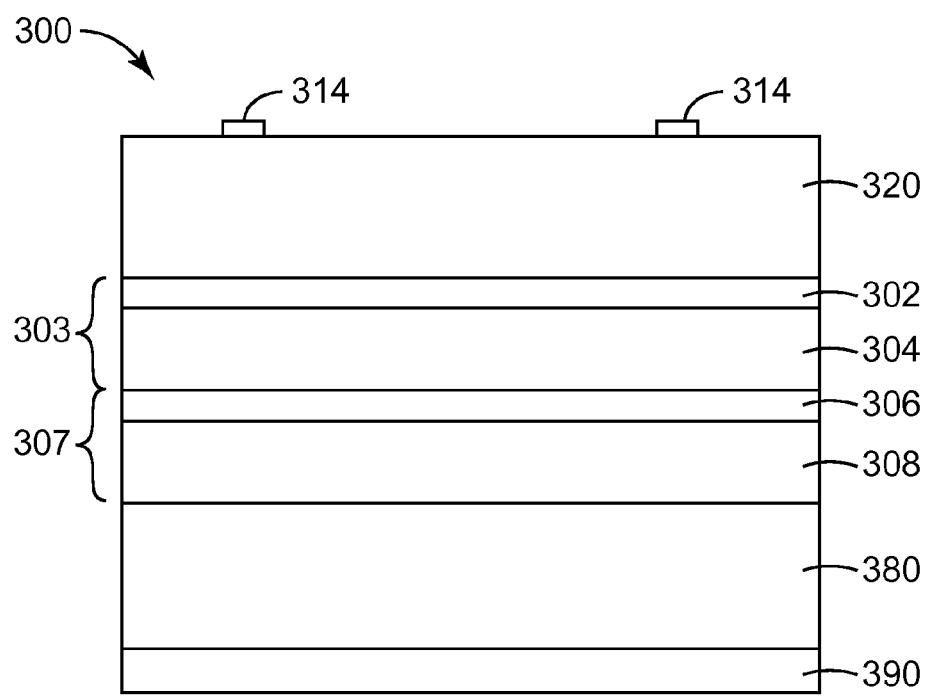
FIG. 3 is a cross-sectional view of a multi-junction solar cell according to the present description.

One potential solution to the problems associated with the construction in FIG. 1 is illustrated by means of the construction in FIG. 2. FIG. 2 provides a multi-junction solar cell 200 according to the present description. Multi-junction solar cell includes a first pn junction 203 that includes a first n-doped III-V semiconductor layer 202 and a first p-doped III-V semiconductor layer 204. In at least some embodiments, the first n-doped semiconductor layer and first p-doped semiconductor layer may be made of (Al)GaInP. Here, parentheses are used to indicate an optional element in the alloy; that is, GaInP is one composition of (Al)GaInP. When used in material compositions throughout this written description, parentheses should be understood to imply an optional element. In other embodiments, the first n-doped semiconductor layer and first p-doped semiconductor layer may be made of InP or Al(Ga)InAs. The multi-junction solar cell further includes a second pn junction 207 that is positioned below (opposite the incident light) the first pn junction 203 in the cell. Second pn junction 207 includes a second n-doped III-V semiconductor layer 206 and a second p-doped III-V semiconductor layer 208. In at least some embodiments, the second n-doped semiconductor layer and second p-doped semiconductor layer may be made of Ga(In)As.

Illustrated in FIG. 2, although not necessarily included in the solar cell, may be a third pn junction 211 made up of a third n-doped III-V semiconductor layer 210 and third p-doped III-V semiconductor layer 212. Where included, the third n-doped semiconductor layer and third p-doped semiconductor layer may be made of, e.g., germanium. The multi-junction solar cell 200 also includes electrode 214 made up of interconnected segments. However, unlike the embodiment illustrated in FIG. 1, the present description provides a current spreading layer 220 above the first pn junction 203 (on the side of incident light 230). The current spreading layer is made up of a II-VI semiconductor layer that is epitaxially grown on layer 202 at interface 222. The current spreading layer allows current to flow with low resistance across the solar cell's lateral extent before being collected by a segment of electrode 214. The effective current spreading of layer 220 allows the segments of electrode 214 to be spaced apart at a distance $D_E$ that is far greater than in the previously utilized embodiment illustrated in FIG. 1, thus lowering losses due to shadowing on the surface 218 of the solar cell. Although shown from a cross-sectional view, the segments of electrode 214 may be understood as discrete linear electrode segments, the length of which would extend into and out of the page in FIG. 2. Each of the segments may be spaced apart from a closest adjacent segment by a distance $D_E$ of at least 0.1 mm or at least 0.15 mm or potentially even 0.20 mm. In order to provide sufficiently low sheet resistance, it is important that the current spreading layer 220 have a fairly substantial thickness 224, typically greater than 1 micrometer and in some embodiments greater than 10 micrometers.

Electrode 214 provides a low-resistance ohmic contact to the II-VI layer. If the II-VI semiconductor is n-type, electrode 214 may include a layer of a relatively low work function metal, such as Ti, in contact with the semiconductor. If the II-VI semiconductor is p-type, electrode 214 may include a layer of a relatively high work function metal, such as Pd, in contact with the semiconductor. In either case, the remainder of electrode 214 may comprise a metal or alloy with excellent electrical conductivity such Al, Cu, Ag and Au. The thickness of the electrode 214 should be chosen to provide an acceptable loss. For a larger separation between the electrode segments, the current in each segment is increased, so the thickness of the electrode should be increased accordingly. Thus, although not shown to scale, the thickness of the electrodes in the currently described solar cells of FIGS. 2-7 (e.g. 214) should be substantially greater than that of the prior art (e.g. FIG. 1, electrode 114).

Multi-junction solar cell 200 further includes a back electrode 290 for drawing current from the cell in conjunction with electrode 214. Because back electrode 290 is on the surface of the multi-junction solar cell opposite from incident sunlight, it may be both a continuous layer or segmented as electrode 214. Back electrode 290 provides an ohmic contact to the solar cell as well a reflector and a route for heat sinking. The electrode may be any sort of appropriate conductive material known in the art, including but not limited to metals, or metal alloys including: gold, silver, aluminum, nickel, titanium, chromium, platinum, palladium, rhodium, rhenium, ruthenium, tungsten, indium and mixtures and alloys of such. The electrodes may also be formed from transparent conductive oxides such as ITO. The electrodes 214 and 290 may typically be used to provide dc power to an external load or circuit, such as an inverter which in turn provides power to an AC circuit.

The current spreading layer 220 may generally be made of a wide-band-gap II-VI semiconductor material. Particularly suitable II-VI materials grown to construction the current spreading layer 220 may be MgZnSSe, BeMgZnSe, CdMgZnSe, or BeZnTe. The choice of these II-VI materials may be especially effective given the crystalline structure of the III-V semiconductor materials making up the pn junctions (e.g. 203). Preferably, the II-VI layer is grown epitaxially on the III-V surface with a minimum of crystallographic defects (e.g., dislocations) at the heterointerface in order to minimize trapped charge at the heterointerface which could present a barrier to current flow across the heterointerface. This may be achieved by growing the II-VI current spreading layer 220 substantially lattice-matched to the III-V layer (or in other words, lattice-matched to the first n-doped and p-doped layer 202, 204, or junction 203). For example, MgZnSSe or BeMgZnSe may be grown lattice-matched to (Al)GaInP that has been grown on a GaAs or Ge substrate. Similarly, CdMgZnSe or BeZnTe may be grown lattice-matched to InP, or Al(Ga)InAs grown on an InP substrate.

The current spreading layer may also be understood as having a band gap energy that is fairly high, making it transparent to most of the solar spectrum. For example, in some embodiments, the current spreading layer may have a band gap energy that is greater than 2.8 eV, or greater than 3.1 eV, and potentially greater than 3.4 eV. The low concentration of crystallographic defects available through epitaxial growth of the II-VI current spreading layer also allows for high conductivity by providing high carrier mobility and low charge trapping. Low sheet resistance is achieved by doping the II-VI layer with appropriate impurities. Certain II-VI semiconductors, including MgZnSSe, BeZnMgSe, and CdMgZnSe can achieve high conductivity by n-type doping with shallow donors. Therefore, in at least some embodiments, the current spreading layer 220 may be doped. Cl and Al are preferred shallow donors, but alternatives include F, Br, I, Ga and In. Certain II-VI semiconductors, including BeZnTe, can achieve high conductivity by p-type doping with shallow acceptors, N is the preferred shallow acceptor, but alternatives include P, As and Cu. The optimum dopant concentration is typically in the range of $10^{18}$ cm$^{-3}$ to $10^{20}$ cm$^{-3}$. At higher concentrations, a decrease in carrier mobility limits the conductivity that can be achieved. Using appropriate doping and thickness, the sheet resistance of the II-VI current spreading layer may be less than 100 Ohms/square, or even less than 10 Ohms/square. In some embodiments, a potential barrier exists due to the conduction or valence band offset at the heterointerface. The electrical resistance of such a heterobarrier is mitigated by very high dopant concentrations in the II-VI layer near the III-V to promote quantum mechanical tunneling through the heterobarrier. Further discussion of doping II-V epitaxial layers may be found in commonly owned U.S. Pat. No. 5,248,631, incorporated herein by reference in its entirety.

As mentioned briefly, the multi-junction solar cell of the present description need not include a third pn junction. For example, the multi-junction solar cell 300 of FIG. 3 includes a first pn junction 203 with first n-doped III-V semiconductor layer 202 and first p-doped III-V semiconductor layer 204, as well as second pn junction 207 with second n-doped III-V semiconductor layer 206 and second p-doped III-V semiconductor layer 208 as well as current spreading layer 220 and electrode 214. However, no third pn junction below the second pn junction 207 is present in the solar cell 300. A metal back electrode 290 typically covers the surface of the solar cell opposite the II-VI current spreader layer. The back electrode provides an ohmic contact to the solar cell as well a route for heat sinking. In many embodiments a substrate 280 supports the pn junctions of the solar cell and conducts electricity and heat from the junctions to the back contact 290. In one example, the first pn junction 202 comprises of InP or Al(Ga)InAs, and the second pn junction 207 comprises GaInAs(P), both of which are grown on an InP substrate 280. The epitaxial II-VI current spreading layer comprises n-type CdMgZnSe or p-type BeZnTe. Back contact 290 may generally be an electrode similar to that described with respect to FIG. 2.

Figure 4:
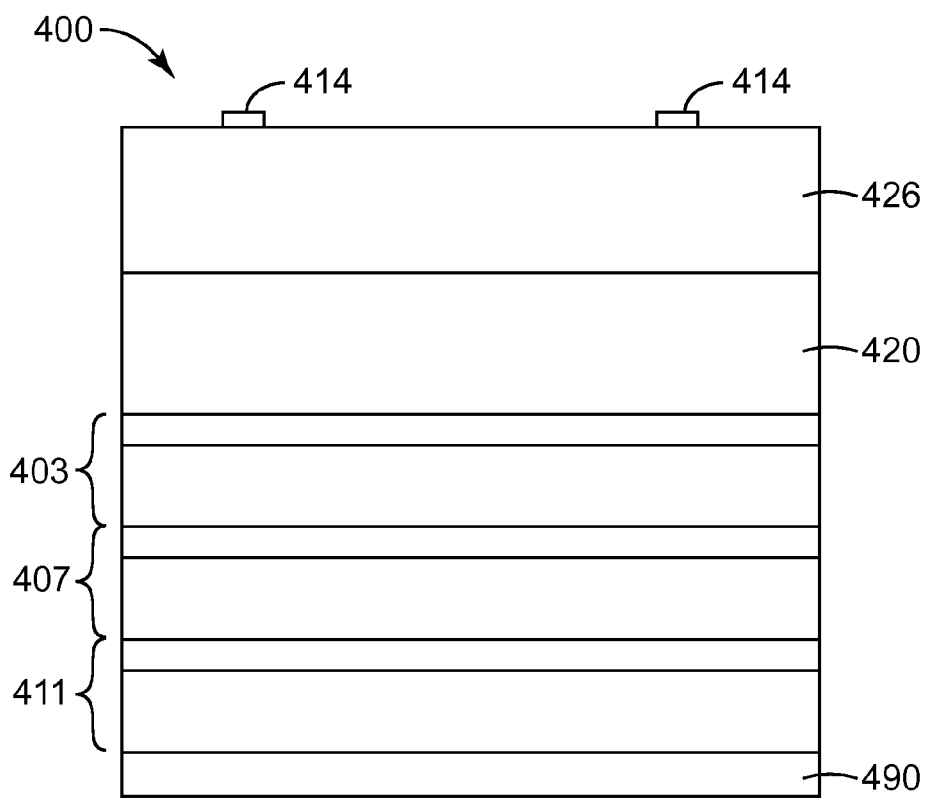
FIG. 4 is a cross-sectional view of a multi-junction solar cell according to the present description.

In another embodiment, as illustrated in FIG. 4, the multi-junction solar cell may include a separate layer between the current spreading layer and the electrode. Multi-junction solar cell 400 includes a first pn junction 403, second pn junction 407, current spreading layer 420 and possibly third pn junction 411 in the same relation to one another as the stack illustrated in FIG. 2. However, rather than placing electrode 414 directly on the surface of the current spreading layer, a transparent conductor 426 is positioned between the electrode 414 and the current spreading layer 420. A back electrode 490, similar to electrode 290 of FIG. 2, is present on the opposite side of the multi-junction solar cell. Unlike most III-VI semiconductors, some II-VI semiconductors do not exhibit strong Fermi-level pinning at free surfaces. Therefore it is possible to fabricate a low-resistance interface between an epitaxial II-VI and a conventional (non-epitaxial) transparent conductor such as ITO (In$_2$O$_3$:SnO$_3$) or ZnO:Al. The addition of a conventional transparent conductor on top of the II-VI epitaxial current spreading layer can help to further decrease losses due to current spreading.

Figure 5:
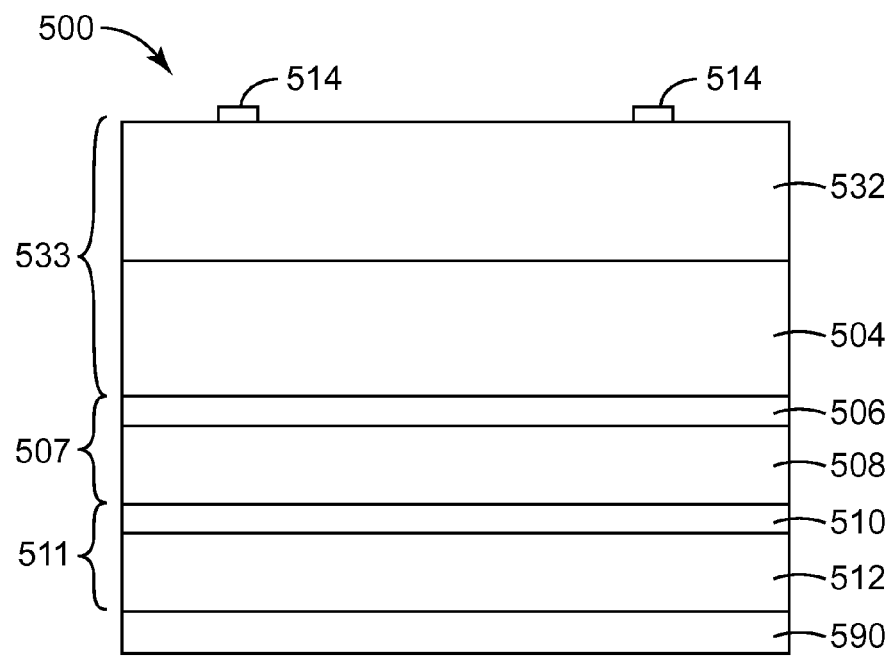
FIG. 5 is a cross-sectional view of a multi-junction solar cell according to the present description.

Another contemplated multi-junction solar cell is illustrated in FIG. 5. Multi-junction solar cell 500 may include a third pn junction 511 made up of third p-doped semiconductor layer 512 and third n-doped layer 511. Third n-doped layer may be stacked below second p-doped layer 508, and second p-doped layer 506, which make up second pn junction 507. However, above second pn junction 507 there are not a separate pn junction along with a separate current spreading layer. Rather, a first p-doped semiconductor layer 504 is positioned on second n-doped semiconductor layer 506. Positioned on the first p-doped layer 504 is a first n-doped, current spreading layer 532. These two layers form pn junction 533. In many of the embodiments described above, the current spreading layer, e.g. 220, may be p-doped. However, the pn junction in these other embodiments will be comprised of, e.g., separate n and p-doped III-V semiconductor layers. Here the n-doped layer that makes up the pn junction is in fact a II-V material and also acts as the current spreading layer in question. Solar cell 660 also includes front electrode 514 facing incident sunlight and back electrode 590 on the opposite surface of the cell.

Of course, in order to properly function effectively, generally the multi-junction solar cells of the current description must be made part of a larger apparatus that also concentrates and directs incident sunlight onto the small cell. One such apparatus is illustrated by the concentrating photovoltaic cell construction 600 of FIG. 6. Concentrating photovoltaic cell construction 600 is made up in part of an optical element 640. Optical element is positioned such that it received incident sunlight 650 on a surface opposite the position of multi-junction solar cell 660. Optical element may be any appropriate lens used to concentrate light and focus it towards a small surface (i.e. the surface of multi-junction solar cell 660). For example, the lens may be a convex lens, such as that shown in FIG. 6, or may be a Fresnel lens, a plano-convex lens, or the like. Any appropriate lens may be used. In addition, although shown as a single optical element 640, optical element 640 may be made up of a plurality of sub-element lenses, potentially with the lenses having different shapes.

Optical element 640 receives incident light 650 and transmits the light as light 630 focused on the surface of multi-junction solar cell 660. The optical element 640 should heavily concentrate the sunlight when it reaches multi-junction solar cell, such that the luminous flux per unit area at the surface of the multi-junction solar cell is far greater than at the surface of optical element 640. In fact, light 630 that reaches multi-junction solar cell should be incident upon the cell with an intensity of over 100 suns, potentially over 150 suns, and potentially even over 200 suns intensity.

Figure 6:
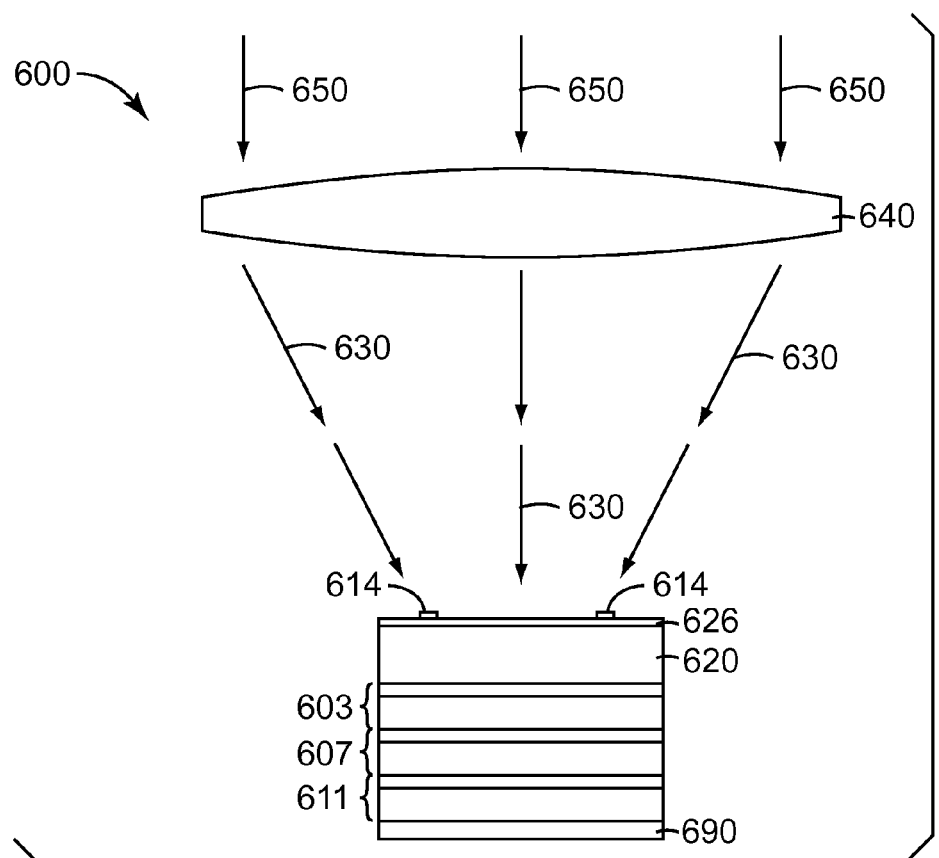
FIG. 6 is a cross-sectional view of a concentrating photovoltaic cell construction according to the present description.

The multi-junction solar cell 660 should be understood to potentially correspond to any of the solar cells described above in FIGS. 2 through 5. As shown in FIG. 6, the multi-junction solar cell is made up in part of a plurality of epitaxial III-V semiconductor pn junctions 603, 607, 611. The cell is further made up in part of an epitaxial II-VI semiconductor current spreading layer 620 that is positioned between the III-V pn junctions 603, 607, 611, and the optical element 640. This positioning is such that focused light 630 from the optical element 640 is incident upon the current spreading layer 620 before it reaches the pn junctions.

As with the solar cells described above, the multi-junction solar cell may include an electrode 614 separated into discrete linear portions and positioned on the surface of the current spreading layer 620 facing the optical element 640. The electrode may in some embodiments be opaque. The discrete linear portions of electrode 614 may be spaced apart, as described with the cell in FIG. 2, by a distance of at least 0.1 mm or at least 0.15 mm or potentially even 0.20 mm. Optionally, as shown with the solar cell of FIG. 4, the multi-junction solar cell 660 may include a transparent conductor 626 that is positioned between the electrode 614 and the current spreading layer 620. Solar cell 500 also includes back electrode 690 on the opposite surface of the cell.

In many embodiments, the pn junctions 603, 607, 611 may be made up of a p-doped and an n-doped III-V semiconductor layer or layers. These layers may be made up of Ge, Ga(In)As, (Al)GaInP, InP, GaInAs, GaInAsP, or Al(Ga)InAs. The current spreading layer 620 will generally be a II-V semiconductor layer, where the layer may be made up of MgZnSSe, BeMgZnSe, CdMgZnSe, or BeZnTe.

Figure 7:
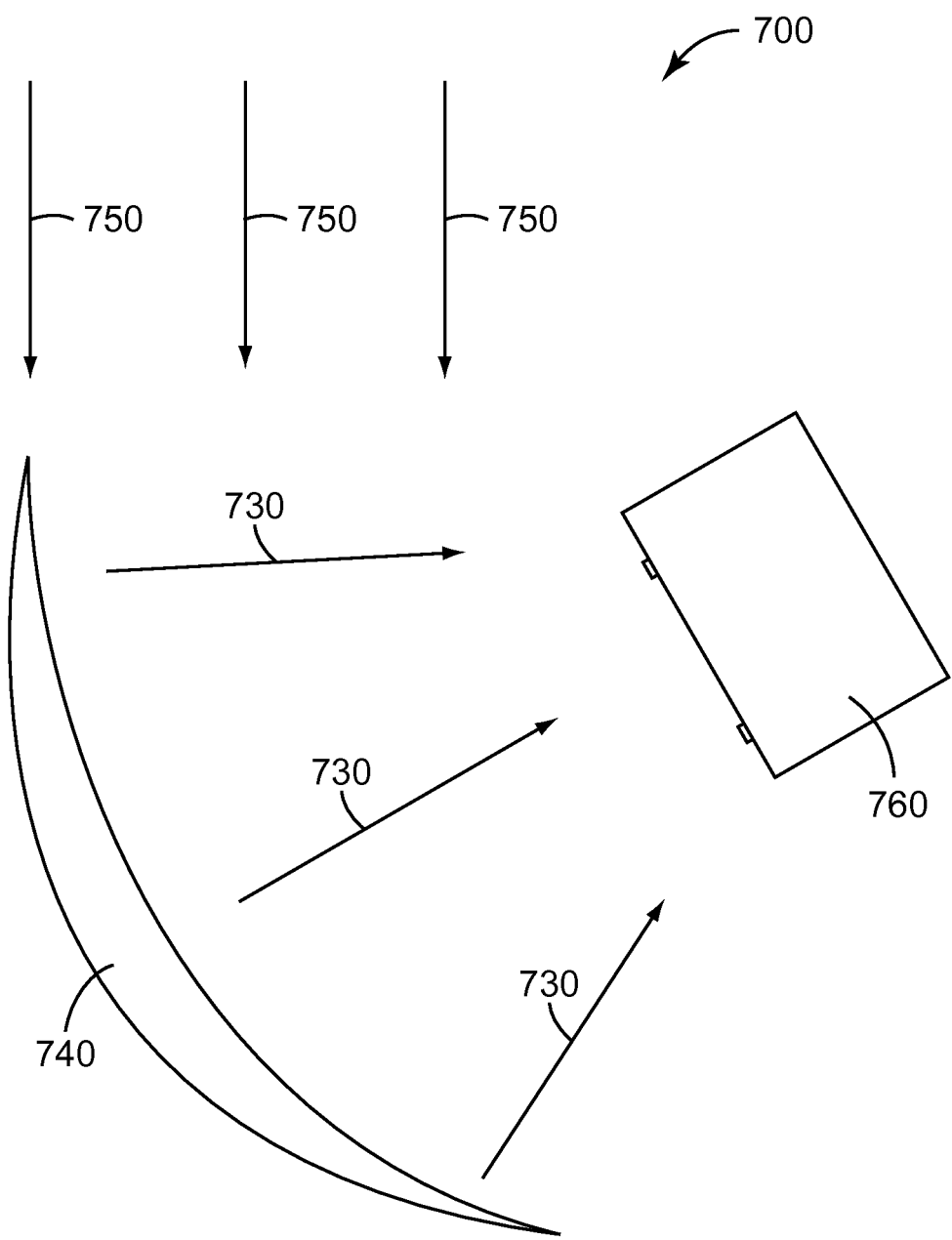
FIG. 7 is a cross-sectional view of a concentrating photovoltaic cell construction according to the present description.

Although in some embodiments, a lens may be used to concentrate light and focus it on the multi-junction solar cell, as shown in FIG. 6, other constructions are also contemplated. For example, FIG. 7 illustrates another embodiment of a concentrating photovoltaic cell construction. Once again, sunlight 750 is incident upon an optical element 740. However, here, the optical element is a mirror 740. In this construction mirror 740 is shaped such that it both reflects light and also focuses it as concentrated light 730 on the small surface area of multi-junction solar cell 760. This embodiments offers an illustration of the wide array of elements that may be used as an optical element in contemplated constructions, so long as the element is capable of concentrating incident sunlight 750 and directing it towards the solar cell.

As discussed initially, the multi-junction solar cells of the present description are significantly more efficient than many in the prior art. The multi-junction solar cells may convert incident sunlight to energy at an efficiency of greater than 35%, greater than 37%, and potentially even greater than 39% or even 40%. For example, at high concentrations (over 400 suns), the addition of an epitaxial II-VI current spreading layer and appropriate electrode and can improve the cell efficiency by 3 percentage points (e.g., from 37% to 40%).

In most embodiments, an antireflective coating on the II-VI current spreading layer is useful for efficiently coupling sunlight into the solar cell.

The present invention should not be considered limited to the particular examples and embodiments described above, as such embodiments are described in detail to facilitate explanation of various aspects of the invention. Rather the present invention should be understood to cover all aspects of the invention, including various modifications, equivalent processes, and alternative devices falling within the spirit and scope of the invention as defined by the appended claims.

I claim:

1. A multi junction solar cell, comprising:
   a first pn junction comprising a first n-doped III-V semiconductor layer and a first p-doped III-V semiconductor layer;
   a second pn junction positioned adjacent to the first pn junction, the second pn junction comprising a second n-doped III-V semiconductor layer and a second p-doped III-V semiconductor layer;
   a current spreading layer positioned adjacent to the first pn junction on the side opposite the second pn junction, the current spreading layer comprising a II-VI semiconductor layer that is disposed directly on a surface of the first pn junction to form an epitaxial structure, wherein the composition of the II-VI semiconductor layer is selected from the group consisting of n-type doped BeMgZnSe and p-type doped BeZnTe; and
   an electrode positioned on the current spreading layer opposite the first pn junction.

2. The multi junction solar cell of claim 1, further comprising a third pn junction positioned adjacent to the second pn junction.

3. The multi junction solar cell of claim 2, wherein the third pn junction comprises Ge.

4. The multi junction solar cell of claim 1, wherein the first n-doped III-V semiconductor layer and the first p-doped III-V semiconductor layer comprise (Al)GaInP, and the composition of the II-VI semiconductor layer comprises the n-type doped BeMgZnSe.

5. The multi junction solar cell of claim 1, wherein the first n-doped III-V semiconductor layer and the first p-doped III-V semiconductor layer comprise InP or Al(Ga)InAs, and the composition of the II-VI semiconductor layer comprises the p-type doped BeZnTe.

6. The multi junction solar cell of claim 1, wherein the second n-doped III-V semiconductor layer and second p-doped III-V semiconductor layer comprise Ga(In)As.

7. The multi junction solar cell of claim 1, wherein the II-VI semiconductor layer is substantially lattice-matched to the first n-doped or p-doped III-V layer to form the epitaxial structure.

8. The multi junction solar cell of claim 1, further comprising a transparent conductor positioned between the electrode and the current spreading layer.

9. The multi junction solar cell of claim 1, wherein the II-VI semiconductor layer is n-type doped and disposed directly on the surface of the first n-doped layer.

10. A concentrating photovoltaic module comprising the multi junction solar cell of claim 1.

11. A concentrating photovoltaic module, comprising:
    an optical element capable of concentrating sunlight; and
    a multi junction solar cell,
      wherein the optical element receives incident sunlight and focuses it on the multi-junction solar cell, such that light with an intensity of over 100 suns is incident upon the multi junction solar cell,
      wherein the multi junction solar cell comprises one or more III-V semiconductor pn junctions and further comprises a semiconductor current spreading layer positioned between the III-V semiconductor pn junctions and the optical element, such that, focused light from the optical element is incident upon the current spreading layer, and wherein the current spreading layer comprises a II-VI semiconductor layer that is disposed directly on a surface of the one or more III-V semiconductor pn junctions to form an epitaxial structure, and the composition of the II-VI semiconductor layer comprises n-typed doped BeMgZnSe, or p-type doped BeZnTe.

12. The concentrating photovoltaic module of claim 11, wherein the multi-junction solar cell converts incident sunlight to energy at an efficiency of greater than 35%.

13. The concentrating photovoltaic module of claim 11, wherein the III-V semiconductor junctions comprise Ge, Ga(In)As, or (Al)GaInP, and the composition of the II-VI semiconductor layer comprises the n-type doped BeMgZnSe.

14. The concentrating photovoltaic module of claim 11, wherein III-V semiconductor junctions comprise InP, GaInAs, GaInAsP, or Al(Ga)InAs, and the composition of the II-VI semiconductor layer comprises the p-type doped BeZnTe.

15. The multi junction solar cell of claim 1, wherein the II-VI semiconductor layer is n-type or p-type doped with a dopant concentration in a range of $10^{18}$ cm$^{-3}$ to $10^{20}$ cm$^{-3}$.

16. The concentrating photovoltaic module of claim 11, wherein the II-VI semiconductor layer is n-type doped with a dopant concentration in a range of $10^{18}$ cm$^{-3}$ to $10^{20}$ cm$^{-3}$, and is disposed directly on the surface of a first n-doped III-V semiconductor layer of the III-V semiconductor pn junctions to form the epitaxial structure.

* * * * *